Feb. 16, 1960 L. W. STANDLEY 2,925,332

METHOD OF ETCHING PRINTING PLATES

Filed June 25, 1956

INVENTOR
LLOYD W. STANDLEY
BY
Burgess, Ryan & Hicks
ATTORNEYS

United States Patent Office 2,925,332

Patented Feb. 16, 1960

2,925,332

METHOD OF ETCHING PRINTING PLATES

Lloyd W. Standley, Southold, N.Y., assignor to Garden Photoengraving Company, Inc., Mineola, N.Y., a corporation of New York Application June 25, 1956, Serial No. 593,493

11 Claims. (Cl. 41—42)

The present invention relates to method of etching printing plates and relates, more particularly, to an improved method of etching a combination printing plate made from an acid soluble metal.

As defined herein, a combination printing plate is one which has half-tone areas, line areas, highlight dropout areas and isolated highlight dot areas on its surface. An object of the present invention is to provide a method of etching such a printing plate which does not require manual application of protective materials to surfaces of the plate that are exposed during the etching. Although plates having certain types of areas, such as line areas or half-tone areas, have been etched previously without the manual application of protective materials, it has not been possible to etch plates having a combination of areas on its surface satisfactorily by such a procedure on a commercial basis prior to the present invention.

Another object of the present invention is to provide a method of etching a combination plate whereby "blanking off" of the etching in certain areas and "shouldering" and "undercutting" at the edges of etched areas on the surface of the plate are prevented.

A further object of the present invention is to provide an economical and fast method of etching combination printing plates which may be carried out on a commercial basis with consistent and reliable results.

Other objects and advantages of the invention will be apparent and better understood from the following application and the accompanying drawings in which.

Figures 1, 2, 3, 4, 5, 6, 7, 8, 9:
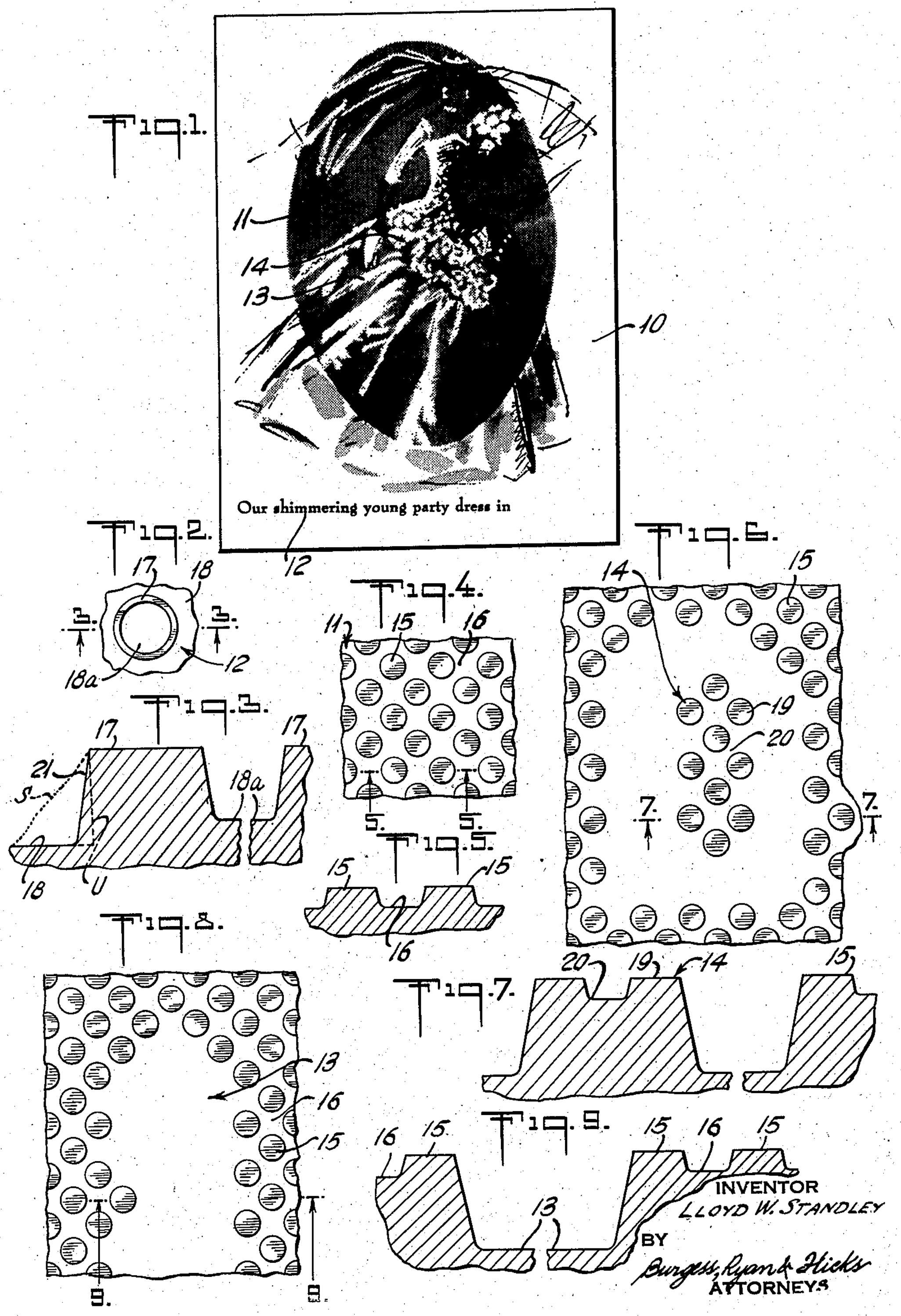
Fig. 1 is a reproduction made from a combination printing plate produced in accordance with the invention and is a plan view of the surface of such a plate in reverse.
Fig. 2 is a fragmentary plan view illustrating a line area on the surface of the printing plate shown in Fig. 1 on an enlarged scale.
Fig. 3 is a section view, on an enlarged scale, taken along the line 3—3 of Fig. 2.
Fig. 4 is a fragmentary plan view illustrating a half-tone area on the surface of the plate shown in Fig. 1 on an enlarged scale.
Fig. 5 is a section view, on an enlarged scale, taken along the line 5—5 of Fig. 4.
Fig. 6 is a fragmentary plan view illustrating an isolated dot area on the surface of the plate shown in Fig. 1 on an enlarged scale.
Fig. 7 is a section view, on an enlarged scale, taken along the line 7—7 of Fig. 6.
Fig. 8 is a fragmentary plan view illustrating a highlight dropout area on the surface of the plate shown in Fig. 1 on an enlarged scale.
Fig. 9 is a section view, on an enlarged scale, taken along the line 9—9 of Fig. 8.

Referring to the drawings, Fig. 1 shows the etched surface of a combination printing plate 10 which has been produced in accordance with the present invention. Fig. 1 is a reproduction made from the etched surface of the printing plate 10 and the inked areas represent the printing surfaces of the plate which are in relief and the uninked areas represent surfaces that have been etched. In a combination plate, the etched areas vary considerably in depth, as will be explained hereinafter, and the present invention is particularly directed to the etching of such a plate without resort to the conventional hand-powdering or similar methods of controlling lateral etching of vertical surfaces exposed during the etching operations.

The plate 10 is made from an acid soluble metal. Suitable metals include magnesium or high magnesium base alloys and zinc or high zinc base alloys. A high magnesium base alloy is an alloy having over 80 percent magnesium and an example of such an alloy is one having a nominal composition of 3 percent aluminum, 1 percent zinc, and 0.2 percent manganese with the balance being magnesium. A high zinc base alloy is one having over 90 percent zinc and an example of such an alloy is one comprising 99.2 percent zinc, the balance being 0.4 percent Pb, 0.35 percent Cd, 0.01 percent Fe and impurities.

The surface of the plate is prepared for etching in the usual manner by reproducing the image that is to be printed on the surface of the plate by well-known photographic processes. The photographic processing develops a resist on surface areas of the plate that are to be in relief which masks and protects such areas against the action of the etching baths to which the surface of the plate is subjected. In the unmasked areas on the surface of the plate, the metal of the plate is exposed and is subjected to the etching action of an acid in an etching bath. This is a standard procedure used in the production of photoengraved printing plates which are commonly used for the reproduction of advertising cuts or similar illustration in newspapers or the like. Printing may be done directly from the surface of such a plate, or an impression of the surface of the plate may be made by means of a mat for the purpose of casting a cylindrical printing plate for use in a rotary press. Thus, it is important to be able to remove such a mat from the surface of the etched printing plate without damage to the mat.

As defined herein, a combination plate is a plate which has a combination of line areas, half-tone areas, highlight dropout areas and isolated dot areas etched on its surface. These areas differ in their surface characteristics and in the depth of etch required in order for satisfactory reproduction of the image to be made from the plate. For illustrative purposes, examples of the various areas on the surface of the combination plate 10 are indicated by reference characters in Fig. 1. A half-tone area is indicated at 11; a line area is indicated at 12; a highlight dropout area is indicated at 13; and an isolated dot areas is indicated at 14.

The surface characteristics of these areas and the depths to which they are etched are shown in enlarged scales by the illustrations of Figs. 2 through 9. As shown in Fig. 4, the surface of the half-tone area 11 consists of small closely spaced relief or printing surfaces 15 separated by spaces or depressions 16 which are etched in the surface of the plate. The printing surfaces are masked with a resist in the photographic process and due to the close spacing of the printing surfaces, the depth to which the spaces 16 are etched can be relatively shallow with a depth of from .005 to .006 of an inch generally being satisfactory.

To provide differences in the tone or shading in the halftone areas, the size shape and spacing of the printing surfaces may be varied. Such variations are commonly designated in terms of the percent of the area occupied by the printing surfaces and range from a 10% dot area to a 90% dot area. The particular halftone area illustrated in Fig. 4 is a 30% dot area. The size and shape of the etched spaces will also vary accordingly from about 0.015 of an inch for a 10% dot area to about 0.001 of an inch for a 90% dot area. When the area of the printing surfaces exceeds the area of the etched spaces, the etched spaces become dots and the printing surfaces occupy the remainder of the area.

As shown in Fig. 2, the line area 12 has solid or continuous printing surfaces 17 which are in relief and are surrounded by open areas 18 etched in the surface of the plate. As shown in Fig. 3, the open areas surrounding the line areas are etched to a depth of approximately .022 to .025 of an inch. An example of a line area is the type formed on the surface of the plate. It will be noted that in certain letters, etched surfaces, as indicated at **18*a***, are surrounded by line surfaces. Where these etched area are small in size, they need not be etched to the full depth as the adjacent printing surfaces will prevent the inking rolls or the paper from contacting them in the printing operation.

As shown in Figs. 8 and 9, the highlight dropout area 13 is an open area etched in the surface of the plate. For satisfactory reproduction, such areas should be etched to a depth of approximately .022 to .025 of an inch. Highlight dropout areas are generally used to provide contrast or detail in the half-tone areas. As will be seen from the surface of the plate 10, the highlight dropout areas vary widely in their dimensions and range in size from relatively small or narrow areas to large or open areas. Here again, the depth of etch required in small areas may be somewhat less than in the large open areas.

The highlight dot area 14, as shown in Fig. 6, consists of an isolated group of small closely spaced relief or printing surfaces 19 which are separated by etched spaces or depressions 20 which have been etched in the surface of the plate. The relief surfaces 19 and the etched spaces 20 correspond, in general, to the relief surfaces and the etched spaces in the half-tone area and the spaces 20 are etched to approximately the same depth as the etched spaces in the half-tone areas. However, the isolated dot areas are entirely surrounded by an etched area, such as a highlight dropout area, which has been etched to a depth of approximately .022 to .025 of an inch.

During the etching of the plate, edges develop or form which define the printing surfaces which are in relief and it is of considerable importance that these edges slope outwardly at a slight angle as they extend downwardly in order for satisfactory reproductions to be made from the plate. An example of such an edge and the angle at which it slopes outwardly as it extends downwardly is indicated at 21 in Fig. 3. When this edge is undercut or slopes inwardly, as indicated by the dotted line U in Fig. 3, the printing surface will be unsupported at its outer edges and may collapse or break away when pressure is applied to it. Such undercutting also makes it difficult to remove a printing mat satisfactorily from the surface of the plate. On the other hand, if this edge slopes outwardly at too great an angle, as indicated by the dotted line S in Fig. 3, it forms a shoulder adjacent the printing surface and poor definition of the printed image will result.

It is also important that small or narrow highlight dropout areas and small openings in the line areas etch to their proper depth without blanking off or stopping of the etching in such areas. Otherwise poor definition and an unsatisfactory printing condition will result.

Hence, it will be seen from the foregoing that rather exacting standards must be met to produce a combination printing plate that will be satisfactory for printing purposes and because of differences in the character of the various areas on the surface of such a plate, it is extremely difficult to control the etching of combination plates with the degree of certainty required for the production of such plates on a commercial basis. However, the present discovery has eliminated these difficulties and makes it possible to etch combination plates with uniform and consistent results.

After the photographic processing of the surface of the plate referred to above has been completed, the plate is placed in an etching machine which contains a half-tone etching bath.

In general, an etching bath of the type disclosed in United States Letters Patent No. 2,640,765, issued June 2, 1952, to Easley et al., for "Etching," may be used in etching the plate and the etching may be carried out in a machine of the type disclosed in United States Letters Patent No. 2,699,048, issued February 16, 1954, to Easley et al., for "Etching Machine." Reference may be made to such patents and the details thereof need not be described here.

Briefly, the etching bath described in said Patent No. 2,640,765 comprises an aqueous solution which contains from 3 to 20 percent of $HNO_3$ and has in admixture therewith an ester of sulfosuccinic acid and an aliphatic alcohol having from 4 to 12 carbon atoms such as dioctyl sodium sulfosuccinate and a water-immiscible organic material such as the various petroleum fractions boiling in the range of 90° to 390° C. of which kerosene, benzine and the diethylbenzenes are examples. In general, the aqueous solution contains from 3 to 20 percent of $HNO_3$ by weight with the amount of the wetting agent ranging from 0.003 to 0.04 times the weight of the $HNO_3$ in the solution and the water-immiscible organic material ranging from 1 to 14 percent of the weight of the nitric acid solution. It will be understood that the present invention is not limited to the particular composition of the etching bath described in said patent and it is not limtied to the use of the machine described in Patent No. 2,699,048.

In order to etch the different areas on the surface of a combination plate to the depths required, the surface of the plate is contacted successively with two etching baths which are known as a half-tone bath and a line bath. In this procedure, a half-tone bath of the following composition may be employed:

*Half-tone etching bath (122 liters)*

| | | |
|---|---|---|
| Nitric acid (42° Bé.) | liters | 17.0 |
| Diethylbenzene | do | 2.5 |
| Dioctyl sodiumsulfosuccinate | grams | 1040 |
| Dissolved magnesium | do | 750 |
| Water | liters | 101.5 |

The temperature of the bath is maintained at 72° F. and the plate is etched for approximately three minutes and twenty-five seconds in this machine. During the etching, the paddles which impinge the bath against the surface of the plate of the machine are set at a speed of about 500 r.p.m. for the first 2½ minutes and at a speed of about 350 r.p.m. for the remaining time.

As a result of the etching in the half-tone bath, the unprotected areas or spaces in the half-tone areas are etched to approximately the required depth. Other unprotected areas on the surface of the plate are also etched to this extent. However, if the etching in the half-tone bath is continued beyond this point, the edges of the more open areas which form during the etching will tend to become too sharp and to undercut. These open areas are the highlight dropout areas and the areas surrounding the line areas. In order to prevent this from occurring, further etching of the plate must be carried out by a second etching bath which is slightly different in composition from the half-tone bath.

However, it has been found that when the plate is transferred from the half-tone bath to the second etching bath, it becomes difficult to control further etching of the plate with any degree of certainty or uniformity in the results obtained. An explanation of this may be that the nitric acid of the half-tone bath reacts with other ingredients in the bath to form a gummy or resinous type of material which has a strong adhesion to the metal surface of the plate. For example, diethylbenzene which is present in the half-tone bath, is a cyclic compound having an aliphatic side chain. This aliphatic side chain may be oxidized by the nitric acid, particularly in the presence of dissolved magnesuim or manganese and the compound converted into peroxides of a gummy or resinous character.

Regardless of the nature of this material or the manner in which it is formed, a residue or film from the half-tone bath remains on and adheres to the etched surface of the plate when the plate is removed from the bath. This residue hardens quickly when air strikes the plate and forms a sticky or tacky deposit which cannot be readily removed from the surface of the plate as by washing the plate with water. This deposit acts as a resist and interferes with further etching of the plate, particularly at the flat surfaces adjacent edges which form or develop during the half-tone etching. Thus, shouldering is apt to occur at the edges of the open areas and blanking off of the etching is apt to occur in the small or confined areas.

It has been discovered that when such deposit or coating is removed from the surface of the plate, surface areas of the plate which require further etching may then be etched satisfactorily to the required depths under controlled conditions and with uniformity in the results obtained. Thus, it is essential to remove this deposit from the etched surface of the plate before further etching of the plate is attempted. In the removal of the deposit, care must be exercised to prevent damage to the resist on surfaces which are masked or coated in the photographic process to protect them against the action of the etching solution. A satisfactory way of removing the deposit is to apply an aqueous solution containing a cleaning agent such as an alkaline material to the etched surface of the plate. When the surface of the plate has been wet thoroughly with a solution containing a mild alkaline cleansing material, the deposit will be softened sufficiently so that it can thereafter be removed without damage to masked areas by applying an aqueous solution containing a detergent of the wetting agent type to the etched surface of the plate and scrubbing the surface briskly with a bristle brush.

If the plate is transferred from the half-tone etching bath to the washing solution before the deposit hardens, it may be possible to remove the deposit by scrubbing the etched surface of the plate with the solution containing the detergent of the wetting agent type or a solution containing a mixture of the alkaline material and the detergent. However, to insure complete removal of the deposit without damage to the photographic resist it is generally desirable to wash the plate with the alkaline solution first.

Suitable mild alkaline materials for use in the washing solution are trisodium phosphate, borax, sodium silicates or combinations thereof such as trisodium phosphate and sodium metasilicate. Such a material is available commercially under the trade name "OAKITE." The concentration of the solution may vary widely and saturated or nearly saturated solution may be used.

The detergent used in the second solution should be of the wetting agent type. There are many such detergents available and examples are detergents containing fatty alcohol sulfates, such as lauryl sulfate combined with polyphosphate or super-polyphosphates are suitable for this purpose. Other suitable wetting agents include alkyl aryl sulfonates such as sodium isopropyl naphthalene sulfonate, sodium butyl biphenyl sulfonate; dialkyl sulfosuccinates such as diamyl sodium sulfosuccinate wherein the alkyl group may have from six to eighteen carbon atoms. Such detergents are available commercially under the trade names "ALL," "STEAD," and "SOILAX."

Here again the concentration may vary widely and a saturated or nearly saturated solution may be used.

After the deposit or coating has been removed from the etched surface of the plate as described above, the plate may then be rinsed and further etching of the surface of the plate may be carried out.

For such further etching, the plate is placed in a second etching machine of the same type which contains a line etching bath. A specific example of a line bath of suitable composition is as follows:

*Line etching bath (122 liters)*

| | | |
|---|---|---|
| Nitric acid (42° Bé.) | liters | 14.0 |
| Diethylbenzene | do | 14.0 |
| Dioctyl sodiumsulfosuccinate | grams | 1340 |
| Gelatin (0.10% stock sol.) | milliliters | 350.0 |
| Dissolved magnesium | grams | 250.0 |
| Water | liters | 92.5 |

The temperature of the line bath is maintained at 72° F. during the etching and the plate is etched for about six minutes in the line machine. During the etching, the paddle speed of the machine is regulated as follows:

30 seconds at 540 r.p.m.
45 seconds at 520 r.p.m.
45 seconds at 500 r.p.m.
45 seconds at 480 r.p.m.
44 seconds at 460 r.p.m.
40 seconds at 440 r.p.m.
40 seconds at 420 r.p.m.
40 seconds at 400 r.p.m.
30 seconds at 380 r.p.m.

It will be noted that the second etching bath includes a gelatin solution. The purpose of the gelatin solution is to increase the etching action of the bath on flat surfaces adjacent the etched edges of open areas and in confined areas, which are protected to some extent from direct impingement of the bath thereon in the operation of the machine.

Under the conditions specified above, the open areas on the surface of the plate as well as confined areas are etched to their proper depth without blanking off regardless of the size of the areas and without undercutting or shouldering at the etched edges thereof. Such results may be readily duplicated and satisfactorily etched plates may, thus, be produced on a commercial basis.

When the etching of the plate has been completed, the etched plate is removed from the line machine and after being rinsed, is ready for use.

It will be understood that the specific compositions of the etching baths described above are merely given as examples and the present invention is not directed to the composition of these baths as such. It will also be understood that various modifications and changes may be made in the process described herein without departing from the scope of the invention as defined by the following claims.

I claim:

1. In a method of etching a combination printing plate of an acid soluble metal selected from the group consisting of magnesium, high magnesium-base alloys wherein the surface of the plate is contacted with two etching compositions in separate steps, each of said etching compositions comprising an aqueous solution of $HNO_3$, said solution having in admixture therewith an ester of sulfosuccinic acid and an aliphatic alcohol having from 4 to 12 carbon atoms and a water-immiscible petroleum fraction having an aliphatic side chain, the step of removing from the surface of the plate the residue remaining thereon from the first of said two etching compositions by wetting the surface of the plate with an aqueous solution of a mild alkaline material selected from the class consisting of trisodium phosphate, borax, sodium silicate, and a mixture of at least two of the foregoing materials, and thereafter scrubbing the surface of the plate with an aqueous solution containing a detergent having wetting agent properties before contacting the surface of the plate with the second of said two etching compositions, said detergent being selected from the groups consisting of fatty alcohol sulfates, alkyl aryl sulfonates, and dialkyl sulfosuccinates, each alkyl group of said dialkyl sulfosuccinates having 6 to 18 carbon atoms.

2. The method of etching a combination printing plate as defined in claim 1 wherein the alkaline material is trisodium phosphate.

3. The method of etching a combination printing plate as defined in claim 1 wherein the alkaline material is trisodium phosphate and sodium metasilicate.

4. In a method of etching a combination printing plate of an acid soluble metal selected from the group consisting of magnesium, high magnesium-base alloys, zinc and high zinc-base alloys wherein the surface of the plate is contacted with two etching compositions in separate steps, and the first of said etching compositions comprises an aqueous solution which contains from 3 to 20 percent of $HNO_3$, said solution having in admixture therewith an ester of sulfosuccinic acid and an aliphatic alcohol having from 4 to 12 carbon atoms and a water-immiscible organic liquid selected from petroleum fractions having boiling points in the temperature range of 90° to 390° C., the step of removing from etched surfaces of the plate the residue remaining thereon from the first of said etching compositions by wetting the surface of the plate with an aqueous solution of a mild alkaline material selected from the class consisting of trisodium phosphate, borax, sodium silicate, and a mixture of at least two of the foregoing materials, and then scrubbing the surface of the plate with an aqueous solution containing a detergent having wetting agent properties before contacting the surface of the plate with the second etching composition, said detergent being selected from the groups consisting of fatty alcohol sulfates, alkyl aryl sulfonates, and dialkyl sulfosuccinates, each alkyl group of said dialkyl sulfosuccinates having 6 to 18 carbon atoms.

5. In a method of etching a combination printing plate of an acid soluble metal such as magnesium or high magnesium-base alloys, said plate having portions of its surface masked with an acid resisting coating, the steps of impinging upon the surface of the plate so as to contact both unmasked and masked portions thereof with an etching composition comprising an aqueous solution which contains from 3 to 20 percent $HNO_3$, said solution having in admixture therewith an ester of sulfosuccinic acid and an aliphatic alcohol having from 4 to 12 carbon atoms and a water-immiscible organic liquid, said ester comprising from 0.003 to 0.04 times the weight of the $HNO_3$ in the solution and the water-immiscible organic liquid comprising from 1 to 14 percent of the weight of the aqueous nitric acid solution; then removing from the surface of the plate the residue of said etching composition by wetting the surface of the plate with an aqueous solution of a mild alkaline material selected from the class consisting of trisodium phosphate, borax, sodium silicate, and a mixture of at least two of the foregoing materials, then scrubbing the surface of the plate with an aqueous solution containing a detergent having wetting agent properties, said detergent being selected from the groups consisting of fatty alcohol sulfates, alkyl aryl sulfonates, and dialkyl sulfosuccinates, each alkyl group of said dialkyl sulfosuccinates having 6 to 18 carbon atoms, and then impinging upon the surface of the plate a second etching composition.

6. The method of etching a combination plate as defined in claim 5 wherein the second etching composition includes the same ingredients as the first etching composition.

7. The method of etching a combination plate as defined in claim 5 wherein the water immiscible liquid is a petroleum fraction having a boiling temperature in the range of 90° to 390° C.

8. The method according to claim 5 wherein the ester is dioctyl sodium sulfosuccinate and the water immiscible liquid is diethylbenzene.

9. A method of etching a combination photoengraving plate of acid soluble metal having half-tone and line areas on its surface, said surface being partially masked and having unmasked etchable areas on its surface which include confined areas in half-tone areas and open areas surrounding the line areas, which comprises etching the unmasked areas on the surface of said plate until a depth of approximately 0.005 of an inch is reached in the half-tone areas by subjecting the unmasked areas to a half-tone etching bath, said bath comprising an etching acid, a wetting agent and a petroleum fraction, said petroleum fraction adhering to and retarding action of the etching acid on exposed edges of the metal which are formed around the etched areas as the etching progresses; then stopping the etching of the plate in the half-tone bath and removing from the etched areas on the surface of the plate deposits formed thereon by the action of the etching bath without removing the masking from masked areas of the plate and then etching open areas of the plate to depths of at least .022 of an inch by subjecting the surface of the plate to a line etching bath comprising an etching acid, a wetting agent and a petroleum fraction.

10. A method of etching a combination photoengraving plate as defined in claim 9 wherein the removal of the deposits from the etched areas of the plate comprises applying an aqueous solution of a mild alkaline material to the surface of the plate and scrubbing the etched areas with said solution.

11. A method of etching a combination photoengraving plate as defined in claim 9 wherein the removal of the deposits from the etched areas of the plate comprises applying an aqueous solution of a mild alkaline material to the surface of the plate, scrubbing the etched areas with said solution and then washing the surface of the plate with an aqueous solution of a detergent having wetting properties.

References Cited in the file of this patent

UNITED STATES PATENTS

| | | |
|---|---|---|
| 1,709,327 | Spalding et al. | Apr. 16, 1929 |
| 2,314,285 | Morgan | Mar. 16, 1943 |
| 2,640,765 | Easley et al. | June 2, 1953 |